United States Patent [19]

Presser et al.

[11] 3,999,142
[45] Dec. 21, 1976

[54] VARIABLE TUNING AND FEEDBACK ON HIGH POWER MICROWAVE TRANSISTOR CARRIER AMPLIFIER

[75] Inventors: Adolph Presser, Kendall Park; Edward Mykietyn, W. Windsor, both of N.J.

[73] Assignee: The United States of America as represented by the Secretary of the Army, Washington, D.C.

[22] Filed: Nov. 12, 1975

[21] Appl. No.: 631,245

[52] U.S. Cl. .............................. 330/31; 330/38 M; 333/84 M; 357/51; 357/80
[51] Int. Cl.² ..................... H03F 3/04; H01L 27/02
[58] Field of Search ................... 330/21, 31, 38 M; 333/84 M; 357/51, 80

[56] References Cited
UNITED STATES PATENTS

| | | | |
|---|---|---|---|
| 3,693,118 | 9/1972 | Presser | 333/84 M X |
| 3,796,976 | 3/1974 | Heng et al. | 333/84 M |
| 3,908,185 | 9/1975 | Martin | 357/80 X |
| 3,925,740 | 12/1975 | Steensma | 333/84 M X |

*Primary Examiner*—R. V. Rolinec
*Assistant Examiner*—Lawrence J. Dahl
*Attorney, Agent, or Firm*—Nathan Edelberg; Robert P. Gibson; Kenneth J. Murphy

[57] ABSTRACT

A variable feedback and tuning capacitor, which is fabricated from a bracket with bendable metallic prongs, is attached to the input transmission line of a microwave transistor amplifier. The prongs are placed in close proximity to the collector pad metalization of the carrier and provide a convenient and novel means for RF tuning the amplifier after the transistor is carrier mounted and DC tested.

2 Claims, 2 Drawing Figures

VARIABLE TUNING AND FEEDBACK ON HIGH POWER MICROWAVE TRANSISTOR CARRIER AMPLIFIER

The invention described herein may be manufactured, used and licensed by or for the Government for Governmental purposes without the payment of any royalties thereon.

BACKGROUND OF THE INVENTION

The design of hybrid integrated linear transistor microwave power amplifiers for high power, wide bandwidth and large dynamic range can be most successfully achieved through the use of a Class A operated linear amplifier. The use of Class C type amplifiers while offering high power and good efficiency are rather limited in bandwidth and in dynamic range.

In the linear broadband power amplifier the continued objective is a suitable circuit that can produce the required stable gain and power simultaneously with good power output and efficiency. Unfortunately, there exists no uniform circuit model in the microwave region that can meet all these requirements.

Commercially available transistors can be used in the design of a transistor amplifier circuit for wideband operation in the 1–4 $GH_z$ range. Usually the transistor chip is mounted on a microscript carrier that is suitable for wideband operation and is connected in the common base configuration. The carrier used could be constructed of beryllium oxide material. Base and emitter bonds having a minimum of parasitic reactance, excellent heat conduction and easy interconnection with the microscript carrier are used.

A further consideration in the design of transistor amplifier circuits is the existence of base to collector capacitance of the transistor and the necessity to compensate for this by the use of shunt tuning inductors. In practice, the shunt tuning inductor can be located directly on the carrier close to the chip and this will enhance the bandwidth capability of the transistor and also reduce losses and instabilities.

In Class A operation in a common base configuration usually two independent DC-bias supplies are needed, but it is common to overcome this limitation with an r-f bypass capacitance between base and ground which will effectively DC isolate the base from ground. The base-emitter bias is thus derivable from a resistive voltage divider. Special isolated-base carrier configuration can be designed that eliminates the bandwidth and stability problems which are usually encountered when using this method with packaged devices at high frequencies.

A constant consideration in design of a linear transistor microwave power amplifier is that additional tuning of the transistor chip amplifier circuit is needed after the transistor chip is mounted. In the past the tuning of the transistor chip device was usually accomplished by using a tunable inductor and a fixed capacitor. The tunable inductor was formed by a wire loop extending from the transistor chip to a fixed value blocking capacitor which is also mounted on the carrier. A problem which would arise when an attempt was made to adjust the inductance by changing the inductor loop size was that movement of the loop would tend to damage the transistor chip to which it was attached. Another previously known tuning mechanism consisted of constructing the inductor of two parts. One part of the tuning inductor extended from the transistor chip to an insulated standoff and the second part of the tuning inductor extended from the standoff to the blocking capacitor but this adjustment was limited in range. The object of the present invention is to provide an improved device for RF tuning and feedback adjustment of the transistor chip after the chip has been mounted on a carrier, the device being one that will increase the tuning control as well as not damaging the transistor as was previously the case.

The only known prior art would be the use of bendable capacitor tuning plates as are found in radio receivers and would be described in a communication engineering textbook.

SUMMARY OF THE INVENTION

This invention is a mechanical device for providing a variable tuning and a variable feedback arrangement which is integral to a carrier of a high power microwave transistor. The arrangement facilitates the adjustment of the carrier tuned microwave transistor and also extends the useful frequency band thereof. The described device is especially useful in a high power broadband microwave transistor amplifier.

Satisfactory operation of high power microwave transistors over large bandwidth depend generally upon the minimization of carrier parasitic reactance. However, when utilizing a common base configuration, one must also be concerned with: (a) compensation for the base-collector capacitance over the operating frequency range with a tuning inductance located near the transistor chip on the carrier; and (b) providing a capacitive emitter-collector feedback circuit to extend or shape the gain response in the operating frequency range.

The invention is a device for changing the feedback capacitance of a transistor chip circuit after the chip has been mounted on a carrier. The feedback capacitance is formed by the air gap between ends of a bracket with bendable prongs, wherein the bracket is attached to and placed on top of the input transmission line so that the prongs overlap and are in close proximity to the collector pad metallization of the carrier. For increased conductivity and corrosion resistance, the metal prongs may be formed from gold plated beryllium copper. The gap between the prongs and the metallization is varied by bending the prongs to change the air gap and cause the feedback capacitance to vary.

BRIEF DESCRIPTION OF THE PREFERRED EMBODIMENT

Figure 1:
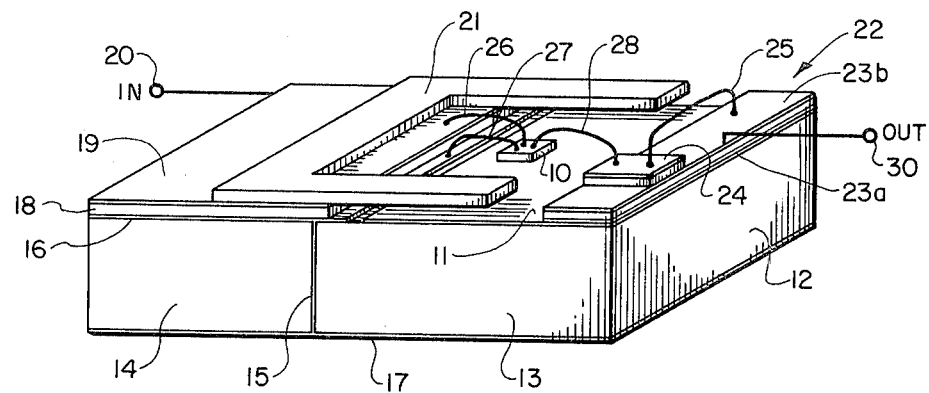
FIG. 1 is a pictorial view of a preferred embodiment of this invention.
Figure 2:
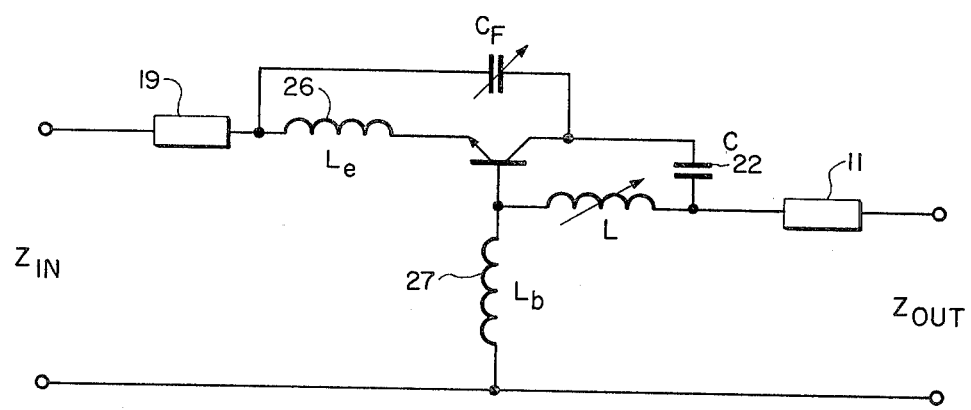
FIG. 2 is an equivalent circuit diagram of FIG. 1.

Referring now more particularly to FIG. 1, common base microwave transistor chip 10 is mounted on a metal film 11 bonded onto a beryllium oxide carrier 12. The beryllium oxide carrier is constructed of two parts 13 and 14 which are bonded together along a metallized bead 15 which is connected to both a top metallic film 16 and a bottom metallic film 17. The metal film 16 and the metal film 11 on which the transistor chip 10 is mounted are separate and not in contact and are thus insulated from each other. On top of the metal film 16 is placed a dielectric material 18 such as rutile or alumina. On top of the dielectric 18 is an input metal film 19. The two metal films 16 and 19 form an input strip transmission line. Attached to the input metal film 19 is an input lead 20.

A U-shaped bendable metallic bracket 21 is mounted so that the base of the bracket 21 is attached to the input metallic film 19. The prongs of the bracket 21 extend outward and over both the beryllium carrier 12 and the metal film 11 placed thereon. The air gap that is formed between the portion of the prong extending over the metal film 11 of the carrier forms a variable feedback capacitor 31. The air gap between the prongs and the metal film can be changed or varied by bending the prongs and hence causing the value of the feedback capacitance to vary.

A blocking capacitor 22 is placed on top of the metal film 11. The blocking capacitor 22 has one terminal 23a in contact with the metal film 11. On top of the other end of the blocking capacitor 22 is placed an insulated standoff 24. An output lead 30 is attached to a second terminal 23b of the blocking capacitor 22.

A first wire lead 26 connects one side of the input transmission line 19 to the emitter terminal of the transistor chip 10. A second wire 27 connects the base terminal of the transistor base 10 to the metal film 16. The inductor L, consists of two separate parts, one part which is formed from a bonding wire 28 extending from the base pad of the transistor chip 10 to the electrically insulated standoff 24 and is then attached to the top electrode 23a of the blocking capacitor 22. The second part of the inductor L is formed from one or more separate bonding wire loops 25 attached from one end of the standoff 24 and connected at the other end to the top electrode 23a of the capacitor 22.

It should be understood, of course, that the foregoing disclosure relates to only a preferred embodiment of the invention and that numerous modifications or alterations may be made therein without departing from the spirit of scope of the invention as set forth in the appended claims.

What is claimed is:

1. An improved transistor amplifier circuit of the common base type:

having a bottom metallic film, a beryllium carrier constructed of two parts bonded together along a metallic bead, said carrier mounted on the bottom metallic film, a first top metallic film placed on top of the first part of the beryllium carrier and extending over a portion of the second beryllium carrier, and a second top metallic film separated from the first top metallic film and positioned on top of the second beryllium carrier and having a transistor chip arranged in the common base configuration mounted on said metallic film, a dielectric material mounted over the first metallic film, a metallic layer placed on top of said dielectric film with an input lead attached to said metallic layer, a blocking capacitor placed on top of the metallic film which extends over the second beryllium carrier, an insulated standoff being placed on top of the blocking capacitor, an inductor consisting of two parts connected from the base of the transistor to said standoff and in turn to said blocking capacitor, an output lead attached to a second terminal of the blocking capacitor, a wire lead connecting the first metallic film to the emitter terminal of the transistor chip, a second wire connecting the base terminal of the transistor chip to the first top metallic film, wherein the improvement comprises in combination with the common base transistor amplifier chip a flat, thin, bendable, selectively positioned U-shaped metallic bracket with a base and two prongs, with the base of the U portion of the bracket attached to the top metallic portion of the input transmission line and the first and second prong of the U bracket extending above and placed in close proximity to the second top metallic film, said prongs moveable in the space between the input and output transmission line whereby said prongs extending above the said metallic film form a variable tuning and feedback capacitor.

2. An improved device as claimed in claim 1 wherein the prongs of the U-shaped metallic bracket are recessible in the space between the dielectric film and the blocking capacitor.

* * * * *